(12) United States Patent
Wang

(10) Patent No.: US 8,115,553 B1
(45) Date of Patent: Feb. 14, 2012

(54) HIGH LINEARITY, LOW NOISE, WIDE BANDWIDTH AMPLIFIER/BUFFER

(75) Inventor: Dejun Wang, Irvine, CA (US)

(73) Assignee: Newport Media, Inc., Lake Forest, CA (US)

(*) Notice: Subject to any disclaimer, the term of this patent is extended or adjusted under 35 U.S.C. 154(b) by 10 days.

(21) Appl. No.: 12/883,051

(22) Filed: Sep. 15, 2010

(51) Int. Cl.
*H03F 1/38* (2006.01)
(52) U.S. Cl. .......................... 330/291; 330/265; 330/264
(58) Field of Classification Search .................. 330/291, 330/265, 264
See application file for complete search history.

(56) References Cited

U.S. PATENT DOCUMENTS

| | | | | |
|---|---|---|---|---|
| 3,376,388 A | * | 4/1968 | Reiffin | 381/121 |
| 4,068,090 A | * | 1/1978 | Komatsu et al. | 381/321 |
| 4,290,026 A | * | 9/1981 | Shoji | 330/255 |
| 4,887,046 A | * | 12/1989 | Gilliland | 330/252 |
| 6,646,508 B1 | * | 11/2003 | Barbetta | 330/264 |
| 7,332,961 B2 | * | 2/2008 | Blednov | 330/149 |
| 8,031,003 B2 | * | 10/2011 | Dishop | 330/276 |

* cited by examiner

*Primary Examiner* — Patricia Nguyen
(74) *Attorney, Agent, or Firm* — Rahman LLC

(57) ABSTRACT

A radio frequency wide band amplifier having a noise that does not exceed a threshold value, and a linearity better than a threshold value. The radio frequency wide band amplifier architecture includes a first stage amplifier and a second stage amplifier. The second stage amplifier includes an input source resistor ($R_{in}$) that receives an input voltage signal, a feedback resistor ($R_{fb}$) directly connected to the input source resistor, a p-type metal-oxide-semiconductor (PMOS) transistor directly connected to the input source resistor. The PMOS transistor receives an output from the input source resistor. A n-type metal-oxide-semiconductor (NMOS) transistor directly connected to the input source resistor. The NMOS transistor receives an output from the input source resistor. A lumped output resistor ($R_{out}$) that receives an output from the feedback resistor, the PMOS transistor, and the NMOS transistor. A terminal of the lumped output impedance is connected to ground.

20 Claims, 4 Drawing Sheets

HIGH LINEARITY, LOW NOISE, WIDE BANDWIDTH AMPLIFIER/BUFFER

BACKGROUND

1. Technical Field

The embodiments herein generally relate to circuit design, and, more particularly, to a radio frequency wide band amplifier/buffer.

2. Description of the Related Art

Wide band amplifier/buffer with low noise and high linearity is desirable to save the cost of system level solution for many of today's bandwidth intensive applications. However, no circuit topologies exist that can simultaneously satisfy low noise, high linearity, reasonable power consumption and acceptable input/output matching at the same time. For example, in today's TV/cable tuner application, the loop through function process of buffering and amplifying input signal is to drive other TV/cable equipment, is preferred to be implemented on silicon to save system level solution cost. However, the loop through functions are carrying noise more than 6 dB.

With a conventional approach, gain and noise can be traded off against each other. Thus, customers have the following choices: a) live with the high noise b) trade off linearity with noise c) using passive splitter solution with increased system level solution cost to achieve 3 dB noise figure and high linearity at the same time. This is only a simple illustration showing that due to the current circuit performance limitation, customer either has to sacrifice performance or live with higher cost.

FIG. 1 is an example application of a cable TV tuner 100 where the loop through amplifier 104 is used to replicate the input signal to drive other TV equipment. The TV tuner RF front end 100 includes a low noise amplifier 102, the loop through amplifier 104, a mixer 106, and a radio frequency Phase locked loop (RF PLL) 108. The low noise amplifier 102 is connected to the mixer 106. The RF PLL 108 is connected to the mixer 106. The radio frequency input signal is transferred to the low noise amplifier 102 to amplify the signal. The baseband signal is received from the mixer. The loop through 104 receives the same radio frequency input signal which is transferred to the low noise amplifier 102 and transfer it to the other TV equipment to deliver the output signal.

FIG. 2A and FIG. 2B illustrate several methods of implementing loop through amplifiers 200A-B. Conventional implementation of the loop through amplifier, which is essentially a wide bandwidth, high linearity, low noise amplifier is implemented in a single stage amplifier. There are two commonly used architecture for single stage loop through amplifier. One is open drain architecture which is shown in FIG. 2A and other one is source degeneration architecture which is shown in FIG. 2B.

The loop through amplifier 200A of FIG. 2A includes an inductance coil 202, a capacitor C 204, a resistor R 206 and a NMOS transistor 208. The capacitor C 204 is directly connected to the resistor R 206. The NMOS transistor 208 is directly connected to the inductance 202. The other end of the NMOS transistor 208 is connected to the ground. The NMOS transistor 208 transfers the radio frequency output signal RF out as low noise, high linearity signal in a single stage. The loop through amplifier 200B of FIG. 2B includes a resistor R 210 and resistor R 214, a NMOS transistor 212. The NMOS transistor 212 is directly connected to the resistor R 210 and the resistor R 214.

Both the implementations (open drain architecture and source degeneration architecture) are carrying a noise figure higher than 6 dB. When any single stage amplifier is used to achieve a 3 dB noise figure, the gain with a matched 75 load will result in a gain of 10 dB to 12 dB from input to output. However, for a wide bandwidth amplifier at a large signal input amplitude, this gain causes distortion both at the amplifier output and the next stage where the signal level is increased. Typically, maximum gain should be less than 4 dB for loop through function to avoid distortion. Thus 2-stage amplifier architecture is needed to achieve desired design specification.

FIG. 3 illustrates a traditional two stage amplifier 300 that is mandated by the system to achieve a low noise and high linearity at the same time. The two stage amplifier includes a impedance R 302, a NMOS transistor 304, and a second stage amplifier 306. The impedance R 302 is directly connected to the NMOS transistor 304. The NMOS transistor 304 receives the radio frequency input signal RF in. In the first stage amplifier, the gain is limited with a low impedance to not cause degradation of linearity. The second stage amplifier 306 outputs the radio frequency output signal RFout as low noise and high linearity signal. If the first stage amplifier's gain is limited by a conventional impedance, which is a resistor, then the resistor R 302 contributes noise referred to the input and defeats lowering noise in the first place.

The $2^{nd}$ stage amplifier 306 is used with the first stage amplifier to reduce the noise to 3 dB. The gain of the first stage amplifier is limited by using a low impedance to avoid distortion. However, because of the reduced gain, if a conventional impedance, which is a resistor, e.g., the resistor 302 is used, it will contribute noise referred to the input. Conventional implementation may not work as the contradictory requirement of high linearity and low noise cannot be met at the same time. Accordingly, there remains a need to achieve low noise and high linearity at the same time and simultaneously meet the stringent requirement of low noise and high linearity.

SUMMARY

In view of the foregoing, an embodiment herein provides a radio frequency wide band amplifier architecture having a noise that does not exceed a threshold value, and a linearity better than a threshold value. The radio frequency wide band amplifier architecture includes a first stage amplifier and a second stage amplifier. The second stage amplifier includes an input source resistor (Rin) that receives an input voltage signal, a feedback resistor (Rfb) directly connected to the input source resistor, a p-type metal-oxide-semiconductor (PMOS) transistor directly connected to the input source resistor. The PMOS transistor receives an output from the input source resistor. A n-type metal-oxide-semiconductor (NMOS) transistor directly connected to the input source resistor. The NMOS transistor receives an output from the input source resistor. A lumped output resistor (Rout) that receives an output from the feedback resistor, the PMOS transistor, and the NMOS transistor. A terminal of the lumped output resistor is connected to ground.

A gain of the second stage of said radio frequency wide band amplifier architecture is determined in accordance with equation:

$$\text{Gain} = \left(g_m - \frac{1}{R_{fb}}\right)(R_{fb} // R_{out}).$$

The $g_m$ is a trans-conductance of a MOS transistor of the radio frequency wide band amplifier architecture. The $g_m$ equals a trans-conductance of the PMOS transistor ($g_{mp}$) plus a trans-conductance of said NMOS transistor ($g_{mn}$). The $g_m$ is determined in accordance with equation:

$$g_m = g_{mp} + g_{mn}.$$

An input impedance ($Z_{in}$) equals $R_{fb}$ divided by (1+Gain) and is determined in accordance with equation:

$$Z_{in} = \frac{R_{fb}}{1+\text{Gain}}.$$

An output impedance ($Z_{out}$) is determined in accordance with equation:

$$Z_{out} = R_{out} // (R_{fb} + R_{in}) // \left(\frac{R_{fb} + R_{in}}{g_m R_{in}}\right).$$

A square of noise input referred voltage (V2noise_input_referred) is determined in accordance with equation:

$$V^2_{noise\_input\_referred} = \frac{4kT}{\text{Gain}^2}\left(\frac{1}{(1+g_m R_{in}) + \frac{R_{in} + Rfb}{R_{out}}}\right)^2 [R_{fb}(1+g_m R_{in})^2 + \gamma g_m (R_{in} + R_{fb})^2].$$

The lumped output resistor (Rout) receives the output from a drain terminal of the PMOS transistor, and a drain terminal of the NMOS transistor.

The first stage amplifier achieves a low noise with a high transconductance. The second stage amplifier provides a noiseless low impedance to limit the swing of the first stage amplifier to achieve high linearity. The first stage amplifier includes any of a n-type metal-oxide semiconductor (NMOS) transistor, a p-type metal-oxide-semiconductor (PMOS) transistor, or both that provides high transconductance for low input referred noise. The transconductance of the PMOS transistor ($g_{mp}$), the transconductance of the NMOS transistor ($g_{mn}$), and the transconductance $g_m$ is determined in accordance with equation:

$$g_m = g_{mp} + g_{mn}.$$

The second stage amplifier contributes very little noise compared with the noise of the first stage amplifier and provides a low impedance to the first stage amplifier to limit the swing of the output of the first stage amplifier for the benefit of linearity.

In another aspect, a two stage radio frequency wide band amplifier architecture is provided. The two stage radio frequency wide band amplifier architecture includes a first stage amplifier having a noise that does not exceed a threshold value, and a second stage amplifier that limits a swing of an output of the first stage amplifier. The second stage amplifier includes a first n-type metal-oxide-semiconductor (NMOS) transistor that receives an input voltage signal from the first stage amplifier, a p-type metal-oxide-semiconductor (PMOS) transistor directly connected to the first NMOS transistor, a feedback resistor directly connected to the first NMOS transistor, and a load resistor that receives an output from the feedback resistor, the first PMOS transistor, and the second NMOS transistor.

In yet another aspect, a method of using a radio frequency wide band amplifier architecture having a noise that does not exceed a threshold value, and a linearity better than a threshold value is provided. The radio frequency wide band amplifier architecture includes a first stage amplifier and a second stage amplifier. The method includes receiving an input voltage signal in an input source resistor (Rin), directly connecting a feedback resistor (Rfb) to the input source resistor, receiving an output from the input source resistor into a p-type metal-oxide-semiconductor (PMOS) transistor that is directly connected to the input source resistor, receiving an output from the input source resistor into a n-type metal-oxide-semiconductor (NMOS) transistor that is directly connected to the input source resistor, and receiving an output from the feedback resistor, the PMOS transistor, and the NMOS transistor into a lumped output resistor (Rout). A terminal of the lumped output resistor is connected to ground.

A gain of the second stage of the radio frequency wide band amplifier architecture is determined in accordance with equation:

$$\text{Gain} = \left(g_m - \frac{1}{R_{fb}}\right)(R_{fb} // R_{out}).$$

The $g_m$ is a trans-conductance of a MOS transistor of the radio frequency wide band amplifier architecture.

The $g_m$ equals a trans-conductance of the PMOS transistor ($g_{mp}$) plus a trans-conductance of the NMOS transistor ($g_{mn}$). The $g_m$ is determined in accordance with equation:

$$g_m = g_{mp} + g_{mn}.$$

An input impedance ($Z_{in}$) equals $R_{fb}$ divided by (1+Gain) and is determined in accordance with equation:

$$Z_{in} = \frac{R_{fb}}{1+\text{Gain}}.$$

An output impedance ($Z_{out}$) is determined in accordance with equation:

$$Z_{out} = R_{out} // (R_{fb} + R_{in}) // \left(\frac{R_{fb} + R_{in}}{g_m R_{in}}\right).$$

A square of noise input referred voltage ($V^2$noise_input_referred) is determined in accordance with equation:

$$V^2_{noise\_input\_referred} = \frac{4kT}{\text{Gain}^2}\left(\frac{1}{(1+g_m R_{in}) + \frac{R_{in} + Rfb}{R_{out}}}\right)^2 [R_{fb}(1+g_m R_{in})^2 + \gamma g_m (R_{in} + R_{fb})^2].$$

The lumped output resistor ($R_{out}$) receives the output from a drain terminal of the PMOS transistor, and a drain terminal of the NMOS transistor.

The first stage amplifier achieves a low noise with a high transconductance. The second stage amplifier provides a noiseless low impedance to limit the swing of the first stage amplifier to achieve high linearity. The first stage amplifier includes any of a n-type metal-oxide semiconductor (NMOS) transistor, a p-type metal-oxide-semiconductor (PMOS) transistor or both that provides high transconductance for low input referred noise. The transconductance of the PMOS transistor ($g_{mp}$), the transconductance of the NMOS transistor ($g_{mn}$), and the transconductance $g_m$ is determined in accordance with equation:

$$g_m = g_{mp} + g_{mn}.$$

The second stage amplifier contributes very little noise compared with the noise of the first stage amplifier and provides a low impedance to the first stage amplifier to limit the swing of the output of the first stage amplifier for the benefit of linearity.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION OF PREFERRED EMBODIMENTS

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

Figure 1:
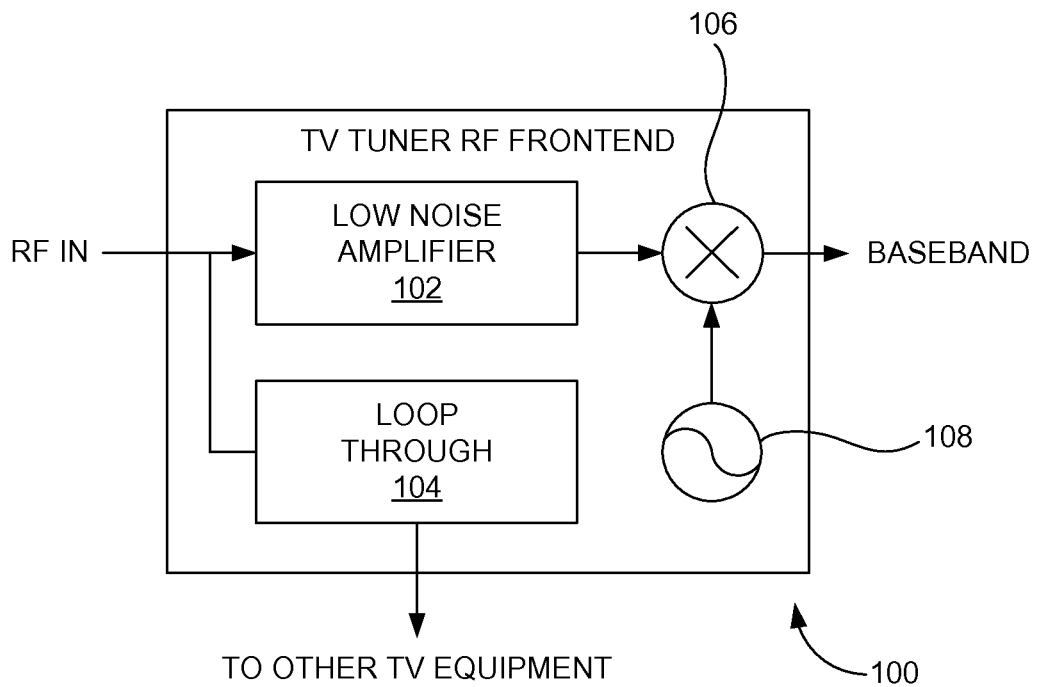
FIG. 1 is an example application of a cable TV tuner where the loop through amplifier is used to replicate the input signal to drive other TV equipment.
Figure 2A:
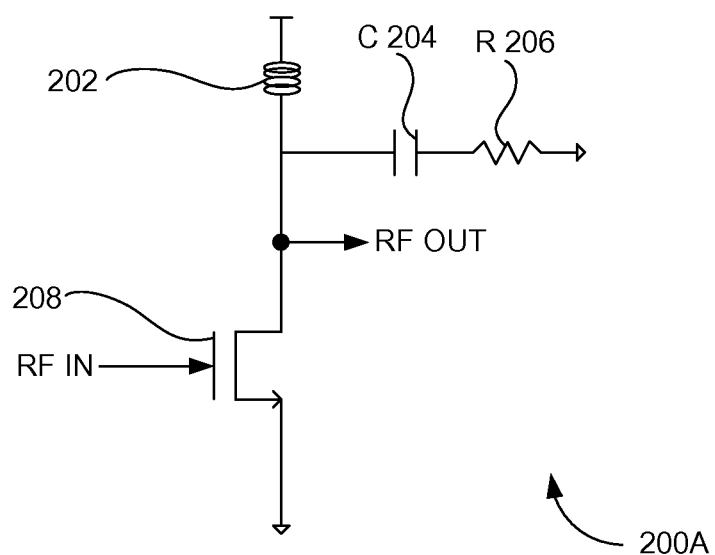
FIG. 2A illustrates schematic diagram of open drain architecture of a loop through amplifier.
Figure 2B:
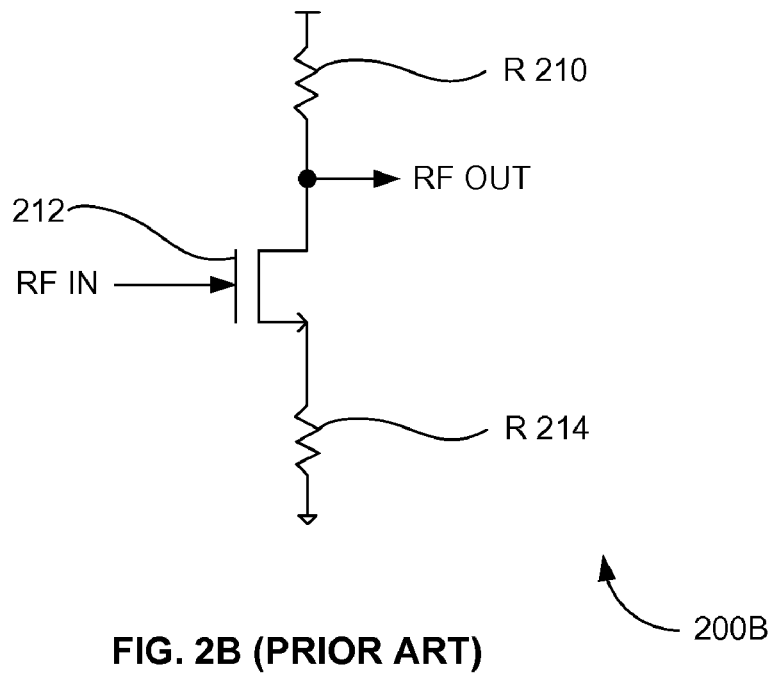
FIG. 2B illustrates schematic diagram of source degeneration architecture of a loop through amplifier.
Figure 3:
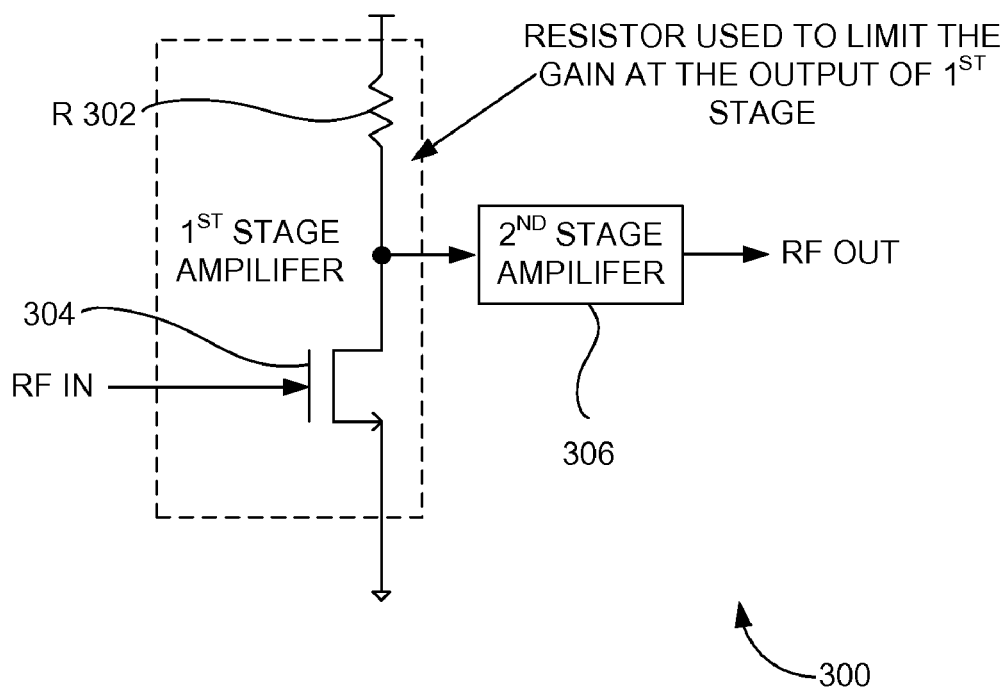
FIG. 3 illustrates a traditional two stage amplifier that is mandated by the system to achieve a low noise and high linearity at the same time.
Figure 4:
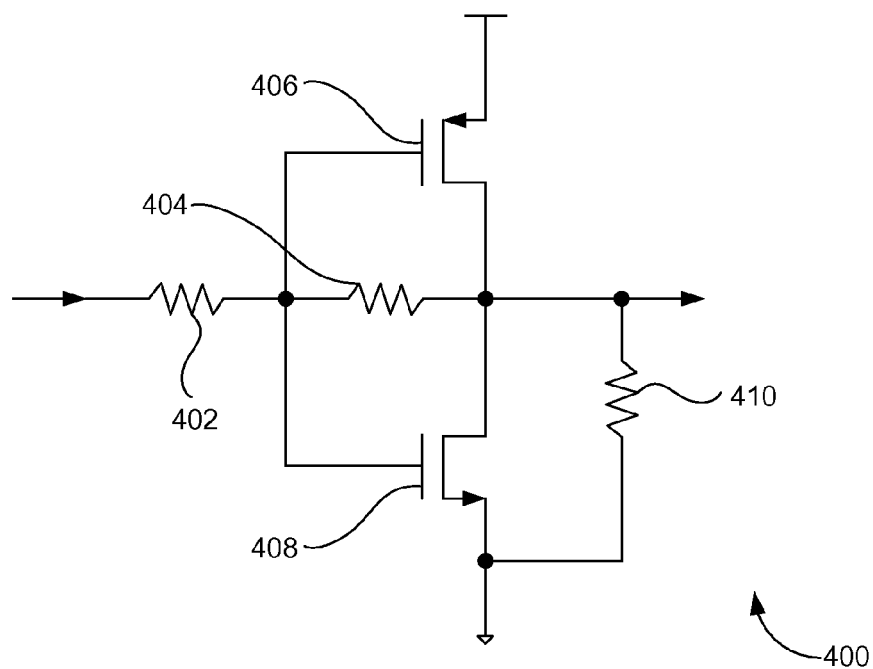
FIG. 4 illustrates a radio frequency wide band amplifier according to an embodiment herein.
Figure 5:
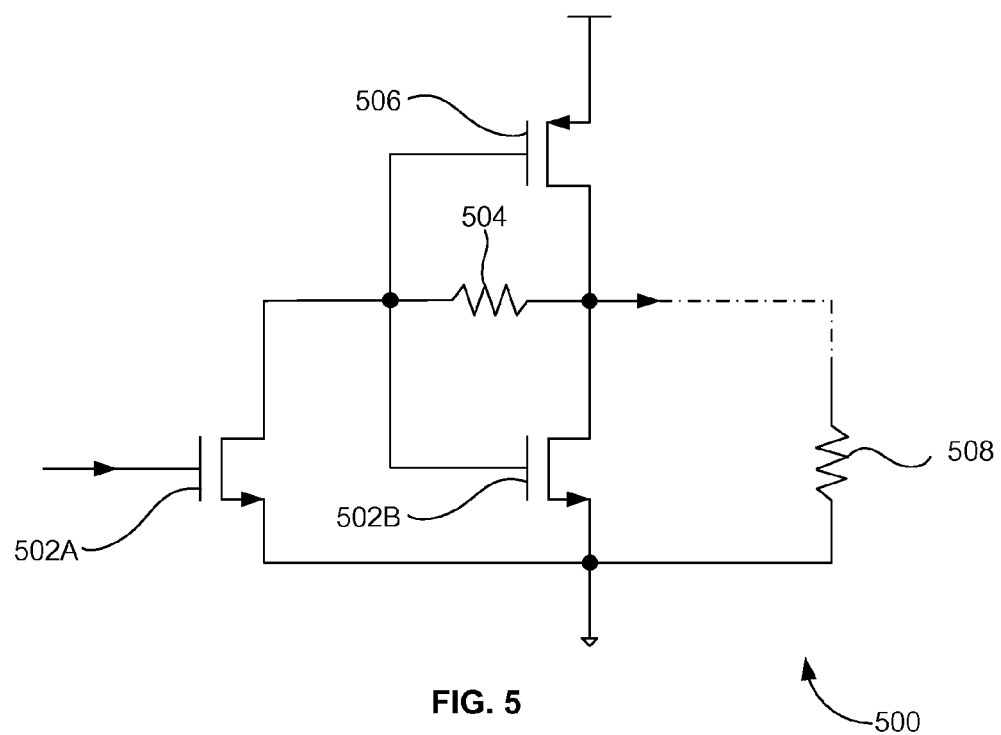
FIG. 5 illustrates a schematic diagram implementation of a two stage amplifier according to the embodiment herein.
Figure 6:
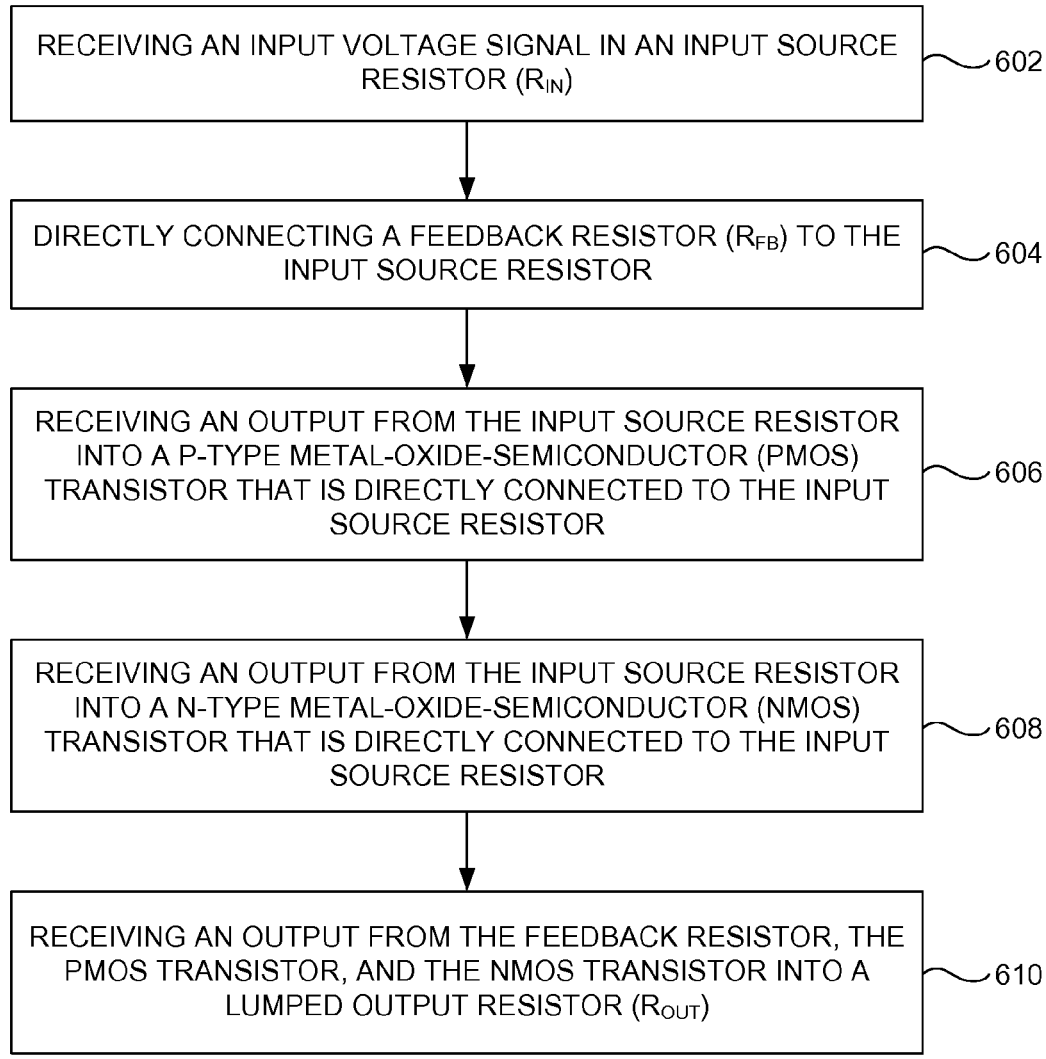
FIG. 6 is a flow diagram illustrating a method of using a radio frequency wide band amplifier architecture having a noise that does not exceed a threshold value, and a linearity better than a threshold value according to an embodiment herein.

As mentioned, there remains a need to achieve low noise and high linearity at the same time and simultaneously meet the stringent requirement of low noise and high linearity. The embodiments herein achieve this by providing a noiseless impedance. More particularly, the embodiments herein utilize a two-stage architecture to achieve low noise and high linearity at the same time. The first stage amplifier provides very high trans-conductance to achieve a low noise figure while the second stage provides a "noiseless" low input impedance to limit the swing of the first stage output for the benefit of linearity. Referring now to the drawings, and more particularly to FIGS. 4 through 6, where similar reference characters denote corresponding features consistently throughout the figures, there are shown preferred embodiments.

FIG. 4 illustrates a radio frequency wide band amplifier 400 according to an embodiment herein. The radio frequency wide band amplifier 400 includes an input source resistor $R_{in}$ 402, a feedback resistor $R_{fb}$ 404, a PMOS transistor 406, a NMOS transistor 408, and a lumped output resistor $R_{out}$ 410. In one embodiment, the radio frequency wide band amplifier 400 is a first stage amplifier. The input source resistor $R_{in}$ 402 receives an input voltage signal. The feedback resistor $R_{fb}$ 404 is directly connected to the input source resistor 402. The PMOS transistor 406 is directly connected to the input source resistor 402 and receives an output from the input source resistor 402. The NMOS transistor 406 is directly connected to the input source resistor 402 and receives an output from the input source resistor 402.

The lumped output resistor $R_{out}$ 410 receives an output from the feedback resistor 404, the PMOS transistor 406, and the NMOS transistor 408. In one embodiment, the lumped output resistor 410 receives the output from the feedback resistor 404, a drain terminal of the PMOS transistor 406, and a drain terminal of the NMOS transistor 408. In another embodiment, other end of the lumped output resistor $R_{out}$ 410 is connected to ground. In one embodiment a gain of the complimentary amplifier 400 is determined in accordance with an equation:

$$\text{Gain} = \left(g_m - \frac{1}{R_{fb}}\right)(R_{fb} \,//\, R_{out}),$$

$g_m$ is a trans-conductance of the radio frequency wide band amplifier. The $g_m$ equals a trans-conductance of the PMOS transistor $g_{mp}$ 406 plus a trans-conductance of the NMOS transistor $g_{mn}$ 408. The $g_m$ is determined by the equation:

$$g_m = g_{mp} + g_{mn}$$

An input impedance $Z_{in}$ equals $R_{fb}$ divided by (1+Gain) and is determined by the equation:

$$Z_{in} = \frac{R_{fb}}{1 + \text{Gain}}.$$

An output impedance Zout is determined by the equation:

$$Z_{out} = R_{out} \,//\, (R_{fb} + R_{in}) \,//\, \left(\frac{R_{fb} + R_{in}}{g_m R_{in}}\right).$$

A square of noise input referred voltage is determined by the equation:

$$V^2_{noise\_input\_referred} = \frac{4kT}{\text{Gain}^2}\left(\frac{1}{(1+g_mR_{in})+\frac{R_{in}+Rfb}{R_{out}}}\right)^2 [R_{fb}(1+g_mR_{in})^2 + \gamma g_m(R_{in}+R_{fb})^2].$$

The variable k is a Boltzmann constant, and the variable T is absolute temperature in Kelvins. In the above equation the noise referred to its input is divided by the gain. Thus, the radio frequency wide band amplifier 400 provides an impedance that does not introduce noise or very little noise. In one embodiment, the radio frequency wide band amplifier 400 includes a noise that does not exceed a threshold value. In another embodiment, the noise does not exceed 3 dB (e.g., the threshold value).

FIG. 5 illustrates a schematic diagram implementation of a two stage amplifier 500 according to the embodiment herein. In one embodiment, the amplifier 500 is a loop through amplifier that includes a NMOS transistor 502A as the first stage amplifier, a feedback resistor $R_{fb}$ 504, a PMOS transistor 506, and a second NMOS transistor 502B as the second stage amplifier, and a load resistor $R_{out}$ 508. The NMOS transistor 502A receives the input signal $V_{in}$. The second NMOS transistor 502B is directly connected to the first NMOS transistor 502A. The PMOS transistor 506 is directly connected to the output terminal of the NMOS transistor 502A.

The NMOS transistor 502B is directly connected to the NMOS transistor 502A. The load resistor $R_{load}$ 508 is directly connected to the feedback resistor 504, the PMOS transistor 506, and the second NMOS transistor 502B. The load resistor 508 receives an output from the feedback resistor 504, the PMOS transistor 506, and the NMOS transistor 502B. One end of the load resistor 508 is connected to ground. The gain of the first stage amplifier, which is the NMOS transistor 502A is limited by the second stage amplifier (502B, 506, 504) and a noise of 3 dB is achieved by the 2 stage amplifier 500. The second stage amplifier 500 limits a swing of an output of the first stage amplifier.

The first stage amplifier, in one embodiment, the NMOS transistor 502A, and the second stage amplifier 500 are directly connected to each other. The second stage amplifier 500 receives an output from the first stage amplifier. The first stage amplifier includes a noise that does not excess a threshold value (e.g., 3 dB). The first stage amplifier provides a high trans-conductance to achieve a low noise that does not exceed the threshold value. The second stage amplifier 500 provides a "noiseless" impedance that limits a swing of the output of the first stage amplifier. Additionally, this architecture with a improved noise eliminate a need of passive filter and thus reduces the cost.

FIG. 6, with reference to FIGS. 4 through 5, is a flow diagram illustrating a method of using the radio frequency wide band amplifier architecture 500 having a noise that does not exceed a threshold value, and a linearity better than a threshold value according to an embodiment herein. The radio frequency wide band amplifier architecture 500 includes the first stage amplifier and the second stage amplifier. In step 602, an input voltage signal is received in the input source resistor ($R_{in}$) 402. In step 604, the feedback resistor ($R_{fb}$) 404 is directly connect to the input source resistor 402. In step 606, an output from the input source resistor 402 is received into the p-type metal-oxide-semiconductor (PMOS) transistor 406 that is directly connected to the input source resistor 402. In step 608, an output from the input source resistor 402 is received into the n-type metal-oxide-semiconductor (NMOS) transistor 408 that is directly connected to the input source resistor 402. In step 610, an output from the feedback resistor 404, the PMOS transistor 406, and the NMOS transistor 408 is received into the lumped output resistor ($R_{out}$) 410. A terminal of the lumped output resistor 410 is connected to ground.

A gain of the second stage of the radio frequency wide band amplifier architecture is determined in accordance with equation:

$$\text{Gain} = \left(g_m - \frac{1}{R_{fb}}\right)(R_{fb} \mathbin{/\mkern-5mu/} R_{out}).$$

The $g_m$ is a trans-conductance of a MOS transistor of the radio frequency wide band amplifier architecture 500. The $g_m$ equals a trans-conductance of the PMOS transistor ($g_{mp}$) plus a trans-conductance of the NMOS transistor ($g_{mn}$). The $g_m$ is determined in accordance with equation:

$$g_m = g_{mp} + g_{mn}.$$

An input impedance ($Z_{in}$) equals $R_{fb}$ divided by (1+Gain) and is determined in accordance with equation:

$$Z_{in} = \frac{R_{fb}}{1+\text{Gain}}.$$

An output impedance ($Z_{out}$) is determined in accordance with equation:

$$Z_{out} = R_{out} \mathbin{/\mkern-5mu/} (R_{fb}+R_{in}) \mathbin{/\mkern-5mu/} \left(\frac{R_{fb}+R_{in}}{g_m R_{in}}\right).$$

A square of noise input referred voltage ($V^2$noise_input_referred) is determined in accordance with equation:

$$V^2_{noise\_input\_referred} = \frac{4kT}{\text{Gain}^2}\left(\frac{1}{(1+g_mR_{in})+\frac{R_{in}+Rfb}{R_{out}}}\right)^2 [R_{fb}(1+g_mR_{in})^2 + \gamma g_m(R_{in}+R_{fb})^2].$$

The lumped output resistor ($R_{out}$) 410 receives the output from a drain terminal of the PMOS transistor 406, and a drain terminal of the NMOS transistor 408. The first stage amplifier achieves a low noise with a high transconductance. The second stage amplifier provides a noiseless low impedance to limit the swing of the first stage amplifier to achieve high linearity. The first stage amplifier includes any of a n-type metal-oxide semiconductor (NMOS) transistor, a p-type metal-oxide-semiconductor (PMOS) transistor or both that provides high transconductance for low input referred noise.

The transconductance of the PMOS transistor ($g_{mp}$), the transconductance of the NMOS transistor ($g_{mn}$), and the transconductance $g_m$ is determined in accordance with equation:

$$g_m = g_{mp} + g_{mn}.$$

The second stage amplifier contributes very little noise compared with the noise of the first stage amplifier and provides a low impedance to the first stage amplifier to limit the swing of the output of the first stage amplifier for the benefit of linearity.

The radio frequency wide band amplifier architecture 500 includes a linearity better than a threshold value. The radio frequency wide band amplifier architecture 500 further includes the first stage amplifier and the second stage amplifier. The first stage amplifier includes a noise that does not excess a threshold value (e.g., 3 dB). The first stage amplifier provides a high trans-conductance to achieve a low noise that does not exceed the threshold value. The second stage amplifier 500 provides a "noiseless" impedance that limits a swing of the output of the first stage amplifier. Additionally, this architecture with an improved noise eliminates a need of passive filter and thus reduces the cost.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A radio frequency wide band amplifier architecture having a noise that does not exceed a threshold value, and a linearity better than a threshold value, said radio frequency wide band amplifier architecture comprising a first stage amplifier and a second stage amplifier, said second stage amplifier comprising:
    an input source resistor ($R_{in}$) that receives an input voltage signal;
    a feedback resistor ($R_{fb}$) directly connected to said input source resistor;
    a p-type metal-oxide-semiconductor (PMOS) transistor directly connected to said input source resistor, wherein said PMOS transistor receives an output from said input source resistor;
    a n-type metal-oxide-semiconductor (NMOS) transistor directly connected to said input source resistor, wherein said NMOS transistor receives an output from said input source resistor; and
    a lumped output resistor ($R_{out}$) that receives an output from said feedback resistor, said PMOS transistor, and said NMOS transistor, wherein a terminal of said lumped output resistor is connected to ground,
    wherein $g_m$ equals a trans-conductance of said PMOS transistor ($g_{mp}$) plus a trans-conductance of said NMOS transistor ($g_{mn}$), and wherein said $g_m$ is determined in accordance with equation: $g_m = g_{mp} + g_{mn}$.

2. The architecture of claim 1, wherein a gain of said second stage of said radio frequency wide band amplifier architecture is determined in accordance with equation:

$$\text{Gain} = \left(g_m - \frac{1}{R_{fb}}\right)(R_{fb} // R_{out}),$$

and wherein said $g_m$ is a trans-conductance of a MOS transistor of said radio frequency wide band amplifier architecture.

3. The architecture of claim 1, wherein said threshold value equals 3 dB.

4. The architecture of claim 2, wherein an input impedance ($Z_{in}$) equals $R_{fb}$ divided by (1+Gain) and is determined in accordance with equation:

$$Z_{in} = \frac{R_{fb}}{1 + \text{Gain}}.$$

5. The architecture of claim 1, wherein an output impedance ($Z_{out}$) is determined in accordance with equation:

$$Z_{out} = R_{out} // (R_{fb} + R_{in}) // \left(\frac{R_{fb} + R_{in}}{g_m R_{in}}\right).$$

6. The architecture of claim 2, wherein a square of noise input referred voltage (V2noise_input_referred) is determined in accordance with equation:

$$V^2_{noise\_input\_referred} = \frac{4kT}{\text{Gain}^2}\left(\frac{1}{(1 + g_m R_{in}) + \frac{R_{in} + Rfb}{R_{out}}}\right)^2 [R_{fb}(1 + g_m R_{in})^2 + \gamma g_m(R_{in} + R_{fb})^2].$$

7. The architecture of claim 1, wherein said lumped output resistor ($R_{out}$) receives said output from a drain terminal of said PMOS transistor, and a drain terminal of said NMOS transistor.

8. The architecture of claim 1, wherein said first stage amplifier achieves a low noise with a high transconductance, and wherein said second stage amplifier provides a noiseless low impedance to limit the swing of the first stage amplifier to achieve high linearity.

9. The architecture of claim 8, wherein said first stage amplifier comprises any of a n-type metal-oxide semiconductor (NMOS) transistor, a p-type metal-oxide-semiconductor (PMOS) transistor or both that provides high transconductance for low input referred noise.

10. The architecture of claim 9, wherein said second stage amplifier contributes very little noise compared with the noise of the first stage amplifier and provides a low impedance to the first stage amplifier to limit the swing of the output of the first stage amplifier for the benefit of linearity.

11. A two stage radio frequency wide band amplifier architecture comprising:
    a first stage amplifier having a noise that does not exceed a threshold value; and
    a second stage amplifier that limits a swing of an output of said first stage amplifier, said second stage amplifier comprising:
        a first n-type metal-oxide-semiconductor (NMOS) transistor that receives an input voltage signal from said first stage amplifier;
        a p-type metal-oxide-semiconductor (PMOS) transistor directly connected to said first NMOS transistor;
        a feedback resistor directly connected to said first NMOS transistor; and a load resistor that receives an output from said feedback resistor, said first PMOS transistor, and said second NMOS transistor, wherein a trans-conductance of said PMOS transistor ($g_{mp}$) plus a trans-conductance of said NMOS transistor ($g_{mn}$) equals $g_m$ such that said $g_m$ is determined in accordance with equation: $g_m = g_{mp} + g_{mn}$, and wherein said $g_m$ is a trans-conductance of a MOS transistor of said radio frequency wide band amplifier architecture.

12. A method of using a radio frequency wide band amplifier architecture having a noise that does not exceed a threshold value, and a linearity better than a threshold value, said radio frequency wide band amplifier architecture comprising a first stage amplifier and a second stage amplifier, wherein said method comprises:

receiving an input voltage signal in an input source resistor ($R_{in}$);

directly connecting a feedback resistor ($R_{fb}$) to said input source resistor;

receiving an output from said input source resistor into a p-type metal-oxide-semiconductor (PMOS) transistor that is directly connected to said input source resistor;

receiving an output from said input source resistor into a n-type metal-oxide-semiconductor (NMOS) transistor that is directly connected to said input source resistor; and receiving an output from said feedback resistor, said PMOS transistor, and said NMOS transistor into a lumped output resistor ($R_{out}$), wherein a terminal of said lumped output resistor is connected to ground, wherein $g_m$ equals a trans-conductance of said PMOS transistor ($g_{mp}$) plus a trans-conductance of said NMOS transistor ($g_{mn}$), and wherein said $g_m$ is determined in accordance with equation: $g_m = g_{mp} + g_{mn}$.

13. The method of claim 12, wherein a gain of said second stage of said radio frequency wide band amplifier architecture is determined in accordance with equation:

$$\text{Gain} = \left(g_m - \frac{1}{R_{fb}}\right)(R_{fb} // R_{out}),$$

and wherein said $g_m$ is a trans-conductance of a MOS transistor of said radio frequency wide band amplifier architecture.

14. The method of claim 12, wherein said threshold value equals 3 dB.

15. The method of claim 13, wherein an input impedance ($Z_{in}$) equals $R_{fb}$ divided by (1+Gain) and is determined in accordance with equation:

$$Z_{in} = \frac{R_{fb}}{1 + \text{Gain}}.$$

16. The method of claim 12, wherein an output impedance ($Z_{out}$) is determined in accordance with equation:

$$Z_{out} = R_{out} // (R_{fb} + R_{in}) // \left(\frac{R_{fb} + R_{in}}{g_m R_{in}}\right).$$

17. The method of claim 13, wherein a square of noise input referred voltage (V2noise_input_referred) is determined in accordance with equation:

$$V^2_{noise\_input\_referred} = \frac{4kT}{\text{Gain}^2}\left(\frac{1}{(1+g_m R_{in}) + \frac{R_{in} + Rfb}{R_{out}}}\right)^2 [R_{fb}(1+g_m R_{in})^2 + \gamma g_m(R_{in} + R_{fb})^2].$$

18. The method of claim 12, wherein said lumped output resistor ($R_{out}$) receives said output from a drain terminal of said PMOS transistor, and a drain terminal of said NMOS transistor.

19. The method of claim 12, wherein said first stage amplifier achieves a low noise with a high transconductance, wherein said second stage amplifier provides a noiseless low impedance to limit the swing of the first stage amplifier to achieve high linearity, wherein said first stage amplifier comprises any of a n-type metal-oxide semiconductor (NMOS) transistor, a p-type metal-oxide-semiconductor (PMOS) transistor or both that provides high transconductance for low input referred noise.

20. The method of claim 19, wherein said second stage amplifier contributes very little noise compared with the noise of the first stage amplifier and provides a low impedance to the first stage amplifier to limit the swing of the output of the first stage amplifier for the benefit of linearity.

* * * * *